US012501751B2

(12) United States Patent
Lin et al.

(10) Patent No.: US 12,501,751 B2
(45) Date of Patent: Dec. 16, 2025

(54) LIGHT-EMITTING DEVICE

(71) Applicant: XIAMEN SANAN OPTOELECTRONICS CO., LTD., Xiamen (CN)

(72) Inventors: Su-Hui Lin, Xiamen (CN); Yu-Chieh Huang, Xiamen (CN); Feng Wang, Xiamen (CN); Anhe He, Xiamen (CN); Qing Wang, Xiamen (CN); Xiushan Zhu, Xiamen (CN); Kang-Wei Peng, Xiamen (CN); Ling-Yuan Hong, Xiamen (CN)

(73) Assignee: XIAMEN SANAN OPTOELECTRONICS CO., LTD., Hongtang Town (CN)

( * ) Notice: Subject to any disclaimer, the term of this patent is extended or adjusted under 35 U.S.C. 154(b) by 638 days.

(21) Appl. No.: 17/945,562

(22) Filed: Sep. 15, 2022

(65) Prior Publication Data

US 2023/0017727 A1 Jan. 19, 2023
US 2024/0387779 A2 Nov. 21, 2024

Related U.S. Application Data

(63) Continuation-in-part of application No. PCT/CN2020/080248, filed on Mar. 19, 2020.

(51) Int. Cl.
*H10H 20/84* (2025.01)

(52) U.S. Cl.
CPC .................................. *H10H 20/84* (2025.01)

(58) Field of Classification Search
CPC ...................................................... H10H 20/84
See application file for complete search history.

(56) References Cited

U.S. PATENT DOCUMENTS 6,891,871 B1 * 5/2005 Nomura ................. H10H 20/84 372/45.01
9,269,867 B2 * 2/2016 Kim ..................... H10H 20/816
(Continued)

FOREIGN PATENT DOCUMENTS

CN 102047445 A 5/2011
CN 102047446 A 5/2011
(Continued)

OTHER PUBLICATIONS

Search Report issued to PCT application No. PCT/CN2020/080248 on Dec. 21, 2020.

*Primary Examiner* — Peter M Albrecht
(74) *Attorney, Agent, or Firm* — Muncy, Geissler, Olds & Lowe, P.C.

(57) ABSTRACT

A light-emitting device includes a semiconductor light-emitting stack, first and second electrodes, an insulating layer, and a passivation layer. Each of the first and second electrodes is disposed on the semiconductor light-emitting stack. The insulating layer at least partially covers the semiconductor light-emitting stack. The passivation layer is disposed on the insulating layer, and covers the semiconductor light-emitting stack and a side surface of each of the first and second electrodes, to expose an upper surface of each of the first and second electrodes. The first electrode and the second electrode are separated by a distance that is greater than 0 μm and that is not greater than 80 μm.

20 Claims, 7 Drawing Sheets

252
230
242
t
241
241
223
242
222
251
221
210
201
2b
2a

(56) References Cited

U.S. PATENT DOCUMENTS

| | | | | |
|---|---|---|---|---|
| 2013/0049063 | A1* | 2/2013 | Kafuku | H10H 20/84<br>257/100 |
| 2018/0287016 | A1* | 10/2018 | Mizobuchi | H10H 20/841 |
| 2021/0036187 | A1* | 2/2021 | Lee | H10H 20/01 |
| 2021/0202794 | A1* | 7/2021 | Lin | H10H 20/82 |

FOREIGN PATENT DOCUMENTS

| | | | |
|---|---|---|---|
| CN | 2016171340 | A | 9/2016 |
| CN | 110890332 | A | 3/2020 |

* cited by examiner

LIGHT-EMITTING DEVICE

CROSS-REFERENCE TO RELATED APPLICATION

This application is a bypass continuation-in-part application of PCT International Application No. PCT/CN2020/080248 filed on Mar. 19, 2020. The entire content of the international patent application is incorporated herein by reference.

FIELD

The disclosure relates to a semiconductor lighting device, and more particularly to a light-emitting device and a display apparatus including the light-emitting device.

BACKGROUND

Recently, there has been rapid growth in light-emitting diode (LED) display technology, which is a sector that continues to grow and move into the next generation. Mini/micro LEDs have become important devices used for display lighting and backlighting in the display technology industry, where they have been applied to curved display devices and ultra-thin lighting devices, since they have obvious advantages such as wide color gamut, high dynamic range (HDR), and dynamic area adjustment.

Referring to FIG. 1, a conventional light-emitting device includes a substrate 901, a buffer layer 910, a first conductivity type semiconductor layer 921, an active layer 922, a second conductivity type semiconductor layer 923, a current spreading layer 930, an insulative and protective layer 940, a first electrode 951, and a second electrode 952.The insulative and protective layer 940 is usually made of silicon oxide or silicon nitride. When the insulative and protective layer 940 is made of silicon oxide, a contact angle between water and the insulative and protective layer 940 is close to 0°, and water vapor tends to be present on a surface of the insulative and protective layer 940. Although the contact angle between water and the insulative and protective layer 940 made of silicon nitride is relatively large, i.e., from 25° to 30°, silicon nitride has large pin-holes. The insulative and protective layer 940 made of silicon oxide or silicon nitride may have a risk of being permeated by water vapor. As shown in FIG. 2, in a case where the light-emitting device is located in an environment with water vapor circulation and is applied with a negative voltage simultaneously, and the water vapor has permeated the insulative and protective layer 940 of the light-emitting device, a current may flow between the current spreading layer 930 and the second conductivity type semiconductor layer 923, thereby causing the current spreading layer 930 to burn.

When the light-emitting device is of a reduced size, a minimum distance between the electrodes decreases and an electric field strength (i.e., a built-in electric field strength formed at a p-n junction) between the electrodes increases because the electric field strength is inversely proportional to the minimum distance. As show in FIG. 3, when the light-emitting device is turned off, water vapor which permeates the light-emitting device may allow a small current to be formed due to the built-in electric field effect. As shown in FIGS. 4 and 5, when the light-emitting device is subjected to a salt water test and a salt spray test which mimic a harsh environment (e.g., an environment containing sodium or chlorine ions), each of the first and second electrodes 951, 952 may be adversely affected by the sodium or chlorine ions, so as to have a rough surface (see FIG. 4) or be partially peeled off (see FIG. 5).

SUMMARY

Therefore, an object of the disclosure is to provide a light-emitting device that can alleviate or overcome the aforesaid shortcomings of the prior art.

According to a first aspect of the disclosure, a light-emitting device includes a semiconductor light-emitting stack, a first electrode, a second electrode, an insulating layer, and a passivation layer.

The semiconductor light-emitting stack includes a first conductivity type semiconductor layer, a second conductivity type semiconductor layer, and an active layer disposed between the first conductivity type semiconductor layer and the second conductivity type semiconductor layer.

The first electrode is disposed on the semiconductor light-emitting stack and is electrically connected to the first conductivity type semiconductor layer.

The second electrode is disposed on the semiconductor light-emitting stack and is electrically connected to the second conductivity type semiconductor layer.

The insulating layer at least partially covers the semiconductor light-emitting stack.

The passivation layer is disposed on the insulating layer and covers the semiconductor light-emitting stack, a side surface of the first electrode and a side surface of the second electrode, to expose an upper surface of each of the first electrode and the second electrode.

The first electrode and the second electrode are separated by a distance That is greater than 0 μm and that is not greater than 80 μm.

According to a second aspect of the disclosure, a display apparatus includes the abovementioned light-emitting device.

BRIEF DESCRIPTION OF THE DRAWINGS

Other features and advantages of the disclosure will become apparent in the following detailed description of the embodiment(s) with reference to the accompanying drawings, in which.

DETAILED DESCRIPTION

Figure 1:
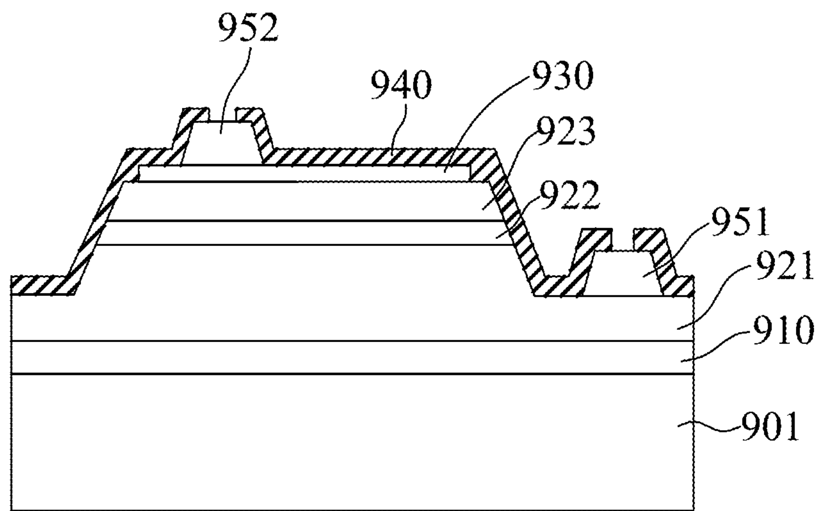
FIG. 1 is a schematic view illustrating a conventional light-emitting device.

Before the disclosure is described in greater detail, it should be noted that where considered appropriate, reference numerals have been repeated among the figures to indicate corresponding or analogous elements, which may optionally have similar characteristics.

It should be noted that, directional terms, such as "vertical," "horizontal," "top," "bottom," "upper," and "lower," may be used to assist in describing the disclosure based on the orientation of the embodiments shown in the figures. The use of these directional definitions should not be interpreted to limit the disclosure in any way.

Figure 6:
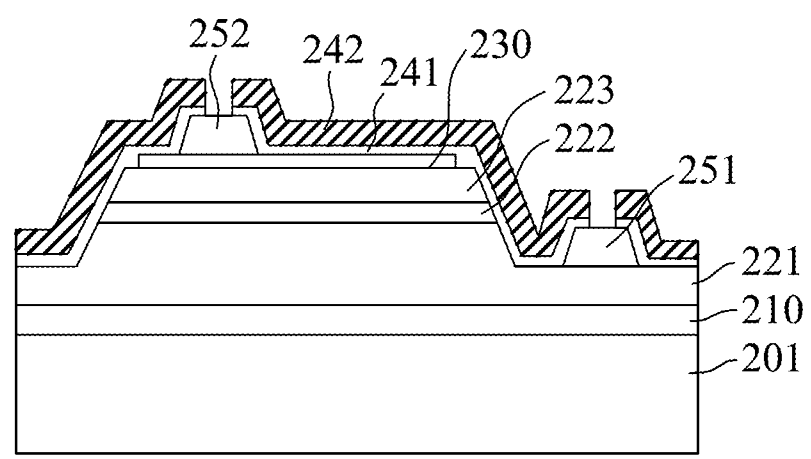
FIG. 6 is a schematic cross-sectional view illustrating a first embodiment of a light-emitting device according to the disclosure.

Referring to FIG. 6, a first embodiment of a light-emitting device according to the present disclosure includes a substrate 201, a semiconductor light-emitting stack, a first electrode 251, a second electrode 252, an insulating layer 241, and a passivation layer 242. In this embodiment, the light-emitting device may have a smaller area of a horizontal cross-section, wherein the horizontal cross-section is parallel to an upper surface of the substrate 201. The size of the light-emitting device may depend on the size of the upper surface of the substrate 201. For example, a side of the upper surface of the substrate 201 may have a length not greater than 300 μm, such as ranging from 20 μm to 300 μm, ranging from 200 μm to 300 μm, ranging from 100 μm to 250 μm, or ranging from 100 μm to 200 μm. For another example, the length of the side of the upper surface of the substrate 201 may be not greater than 100 μm and may be greater than 0 μm, such as ranging from 40 μm to 100 μm. For yet another example, the length of the side of the upper surface of the substrate 201 may range from 40 μm to 250 μm. The substrate 201 may be a light-transmissive substrate, and the upper surface of the substrate 201 may have a surface area that is not greater than 90000 $\mu m^2$ and that is greater than 0 $\mu m^2$, such as not greater than 40000 $\mu m^2$ or not greater than 10000 $\mu m^2$. By having the abovementioned surface area of the upper surface of the substrate 201, the light-emitting device might be easily applied in various electronic apparatus that require a small-sized and/or thin light-emitting device.

The substrate 201 may be a growth substrate. For example, the substrate 201 may be a sapphire substrate, a gallium nitride (GaN) substrate or an aluminum nitride (AlN) substrate. The semiconductor light-emitting stack may be formed on the substrate 201 by physical vapor deposition (PVD), chemical vapor deposition (CVD), epitaxy growth technology, or atomic layer deposition (ALD). The semiconductor light-emitting stack has a first surface and a second surface opposite to the first surface. The semiconductor light-emitting stack includes a buffer layer 210, a first conductivity type semiconductor layer 221, an active layer 222, and a second conductivity type semiconductor layer 223. The semiconductor light-emitting stack may include a group III-V semiconductor material, such as nitrides (e.g., aluminum nitride, gallium nitride, or indium nitride), phosphides (e.g., aluminum phosphide, gallium phosphide, or indium phosphide), or arsenides (e.g., aluminum arsenide, gallium arsenide, or indium arsenide). The first conductivity type semiconductor layer 221 may include one of an n-type impurity (e.g., silicon, germanium, or tin) and a p-type impurity (e.g., magnesium, strontium, or barium), and the second conductivity type semiconductor layer 223 may include the other one of the n-type impurity and the p-type impurity. The active layer 222 is disposed between the first conductivity type semiconductor layer 221 and the second conductivity type semiconductor layer 223. The active layer 222 may be formed as a multi-quantum well structure (MQW), and an elemental composition ratio of the active layer 222 may be adjusted to generate light with a predetermined emission wavelength. In certain embodiments, the semiconductor light-emitting stack may be subjected to an etching process to remove portions of the second conductivity type semiconductor layer 223 and the active layer 222, so as to expose a part of the first conductivity type semiconductor layer 221. In such case, the exposed part of the first conductivity type semiconductor layer 221 may serve as a platform. In alternative embodiments, the semiconductor light-emitting stack may be subjected to an etching process to form a through hole that penetrates the second conductivity type semiconductor layer 223 and the active layer 222, so as to expose the first conductivity type semiconductor layer 221. In this embodiment, the first conductivity type semiconductor layer 221 may be an n-type semiconductor layer. In certain embodiments, the substrate 201 is not a growth substrate, and may be a ceramic substrate, a glass substrate, etc. In such case, the semiconductor light-emitting stack may be connected to the substrate 201 through a bonding layer (not shown). In certain embodiments, the light-emitting device might be a thin light-emitting device without the substrate 201.

The light-emitting device may further include a current spreading layer 230 that is formed on the second conductivity type semiconductor layer 223. The current spreading layer 230 forms an ohmic contact with the second conductivity type semiconductor layer 223. The current spreading layer 230 may include, but is not limited to, a conductive oxide that is light-transmissive or a light-transmissive metal. The conductive oxide may further include a dopant. Examples of the conductive oxide may include indium tin oxide, zinc oxide, zinc indium tin oxide, indium zinc oxide, zinc tin oxide, gallium indium tin oxide, indium gallium oxide, gallium zinc oxide, zinc oxide doped with aluminum, or tin oxide doped with fluorine. Examples of the light-transmissive metal may include nickel, gold or a combination thereof. In certain embodiments, the current spreading layer 230 may have a thickness ranging from 20 nm to 300 nm. In certain embodiments, a surface contact resistance between the current spreading layer 230 and the second conductivity type semiconductor layer 223 is lower than that between a metal electrode (e.g., the second electrode 252) and the second conductivity type semiconductor layer 223.

As such, by having the current spreading layer 230, a forward voltage of the light-emitting device might be reduced and a luminous efficiency thereof might be enhanced.

The first electrode 251 and the second electrode 252 are disposed on the first surface of the semiconductor light-emitting stack, i.e., located at a same side of the semiconductor light-emitting stack. The first electrode 251 is electrically connected to the first conductivity type semiconductor layer 221. The second electrode 252 is electrically connected to the current spreading layer 230. In certain embodiments, each of the first electrode 251 and the second electrode 252 may be formed as a multilayered structure. In certain embodiments, each of the first electrode 251 and the second electrode 252 may include a bottom layer (not shown) that is made of chromium, aluminum, titanium, nickel, platinum, gold, or combinations thereof. In certain embodiments, the bottom layer may be formed as a multilayered structure and layers thereof are made of different metal materials as mentioned above. In certain embodiments, each of the first electrode 251 and the second electrode 252 may further include a metal reflection layer (not shown) and a metal protection layer (not shown) that are disposed on the bottom layer. The metal reflection layer may be made of aluminum, silver or a combination thereof. The metal protection layer is disposed on the metal reflection layer opposite to the bottom layer, and may cover side surfaces of the bottom layer and the metal reflection layer, so as to avoid migration of metal atoms from the bottom layer and prevent the metal reflection layer from being oxidized. In certain embodiments, the metal protection layer may be made of platinum, which has etch-resistant properties and high stability, so as to prevent the formation of a metal black point that may cause poor adhesion with gold wires used in wire bonding.

Figure 7:
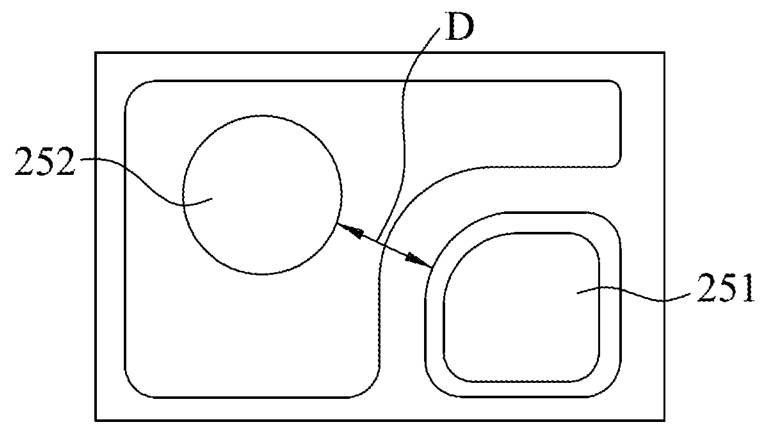
FIG. 7 is a schematic top view illustrating the first embodiment of the light-emitting device according to the disclosure.

As shown in FIG. 7, in this embodiment, the light-emitting device is a lateral-type light-emitting device, the area of horizontal cross-section of the light-emitting device is not greater than 40000 $\mu m^2$ and is greater than 0 $\mu m^2$, and the first electrode 251 and the second electrode 252 are separated by a distance (D) that is greater than 0 μm and that is not greater than 80 μm. The distance (D) is defined by a minimum distance between two projections of the first electrode 251 and the second electrode 252 on the substrate 201. In certain embodiments, the distance (D) may be not smaller than 5 μm and may be not greater than 80 μm. The distance (D) may vary depending on the size of the light-emitting device. For example, when the area of the horizontal cross-section of the light-emitting device ranges from 30000 $\mu m^2$ to 40000 $\mu m^2$, the distance (D) may range from 60 μm to 80 μm. For another example, when the area of the horizontal cross-section of the light-emitting device ranges from 20000 $\mu m^2$ to 30000 $\mu m^2$, the distance (D) may range from 40 μm to 60 μm. For yet another example, when the area of the horizontal cross-section of the light-emitting device is not greater than 20000 $\mu m^2$ and is greater than 0 $\mu m^2$, the distance (D) may range from 20 μm to 40 μm.

The insulating layer 241 at least partially covers the semiconductor light-emitting stack, and covers the current spreading layer 230 and side surfaces of the first electrode 251 and the second electrode 252, to expose an upper surface of each of the first electrode 251 and the second electrode 252. The insulating layer 241 may be made of an insulating material rich in silicon, and has a trap energy level (trapping center) with a relatively high density of carriers, which can increase carrier concentration in the trapping center and reduce a built-in electric field effect caused by the smaller distance (D) between the first and second electrodes 251, 252. The insulating layer 241 may be made of $Si_{x1}N$, $Si_{x2}ON$, $Si_{x1}N$ doped with phosphorus, and $Si_{x2}ON$ doped with phosphorus, wherein x1 is a mole ratio and is greater than 0.75 (e.g., ranging from 0.8 to 2), and x2 is a mole ratio and is greater than 0.5 (e.g., ranging from 0.6 to 0.8). The insulating layer 241 may have a thickness ranging from 2 nm to 100 nm (e.g., from 5 nm to 100 nm).

The passivation layer 242 is disposed on the insulating layer 241, and covers the semiconductor light-emitting stack, the current spreading layer 230, and the side surfaces of the first electrode 251 and the second electrode 252, to expose the upper surface of each of the first electrode 251 and the second electrode 252. The passivation layer 242 may be made of an insulating material with small-sized pin-holes. The insulating material may include silicon oxide ($SiO_2$), aluminum oxide ($Al_2O_3$), or a combination thereof. In certain embodiments, she passivation layer 242 may have a thickness ranging from 100 nm (0.1 μm) to 5 μm. Because the size of the pin-holes decreases as the passivation layer 242 increases in thickness, in alternative embodiments, the passivation layer 242 may have a thickness that is not smaller than 200 nm (0.2 μm), such as ranging from 200 nm to 1500 nm or ranging from 1.5 μm to 5 μm.

In this embodiment, the insulating layer 241 that is made of the insulating material that is rich in silicon and that has the carrier trapping effect is formed on the semiconductor light-emitting stack. The insulating layer 241 directly contacts the active layer 222, so as to reduce the built-in electric field effect of the light-emitting device. In addition, the insulating layer 241 and the passivation layer 242 simultaneously cover the semiconductor light-emitting stack, the current spreading layer 230 and the side surfaces of the first and second electrodes 251, 252, and extend to the upper surfaces of the first and second electrodes 251, 252. The insulating layer 241 has better hydrophobicity, and the passivation layer 242 has small-sized pin-holes. When the light-emitting device includes a plurality of the insulating layers 241 and a plurality of the passivation layers 242, the insulating layers 241 and the passivation layers 242 may be alternately stacked on the semiconductor light-emitting stack, so as to reduce permeation of water vapor in the light-emitting device.

In this embodiment, the first surface of the semiconductor light-emitting stack may have a light-emitting area and an electrode area on which the first electrode 251 and the second electrode 252 are disposed, and the insulating layer 241 covers the light-emitting area.

In addition, the insulating layer 241 is formed to be disposed between the side surface of the first electrode 251 and the passivation layer 242, and between the side surface of the second electrode 252 and the passivation layer 242.

In a variation of this embodiment, the insulating layer 241 is made of $Si_{a1}N$, where a1 is a mole ratio and is greater than 0.8 and not greater than 2 (e.g., not greater than 1.0) and the passivation layer 242 is made of $Si_{a2}N$, where a2 is a mole ratio and is not smaller than 0.6 and not greater than 0.8. The passivation layer 242 made of $Si_{a2}N$ is formed as a silicon nitride film having a stoichiometric ratio close to that of the insulating layer 241, and thus, the quality of the passivation layer 242 is improved. When a1 is greater than 2, the insulating layer 241 may absorb a large amount of light, thereby reducing lighting efficiency of the light-emitting device. In this embodiment, by controlling silicon content of each of the insulating layer 241 and the passivation layer 242, the built-in electric field effect may be reduced and water vapor permeation may be avoided.

Figure 8:
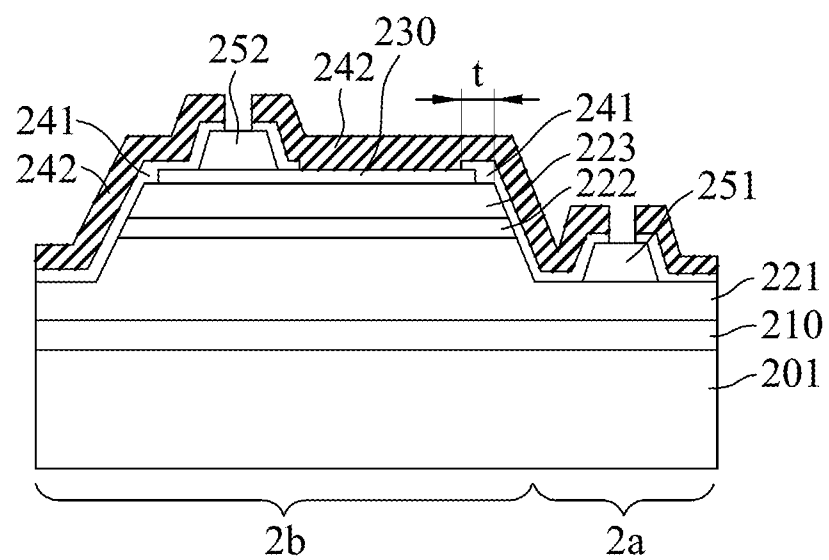
FIG. 8 is a schematic cross-sectional view illustrating a second embodiment of the light-emitting device according to the disclosure.

Referring to FIG. 8, a second embodiment of the light-emitting device according to the present disclosure is generally similar to the first embodiment, except for the following differences.

An upper surface of the light-emitting device serves as a light-emitting surface, and most of light emitted from the active layer 222 is transmitted outwardly through the upper surface of the light-emitting device.

In this embodiment, the insulating layer 241 partially covers the first surface of the semiconductor light-emitting stack and a part of the passivation layer 242 is in direct contact with a part of the first surface of the semiconductor light-emitting stack, which is exposed from the insulating layer 241 and is in correspondence with the light-emitting area of the semiconductor light-emitting stack). Because the insulating layer 241 may be made of the insulating material rich in silicon and may have a transmittance that is lower than that of the passivation layer 242, with such configuration that the part of the passivation layer 242 is in direct contact with the exposed first surface of the semiconductor light-emitting stack, the luminous efficiency of the light-emitting device might be prevented from being adversely affected by the insulating layer 241.

The semiconductor light-emitting stack may include a first part 2*a* and a second part connected 2*b* to the first part 2*a*, the first electrode 251 is disposed on the first part 2*a*, the second electrode 252 is disposed on the second part 2*b*, each of the first part 2*a* and the second part 2*b* has an upper surface, and the second part 2*b* includes a sidewall that has an interconnecting surface that interconnects the upper surface of the first part 2*a* and the upper surface of the second part 2*b*. The upper and interconnecting surfaces of the second part 2*b* and the upper surface of the first part 2*a* corporately form a part of the first surface. In this embodiment, a portion of the insulating layer 241 is partially disposed on the first electrode 251, extends to the interconnecting surface of the second part, and partially covers the upper surface of the second part. A region of the portion of the insulating layer 241, which is disposed on the upper surface of the second part 2*b*, has a width (t) that is not smaller than 5 μm, such as ranging from 5 μm to 20 μm.

Figure 9:
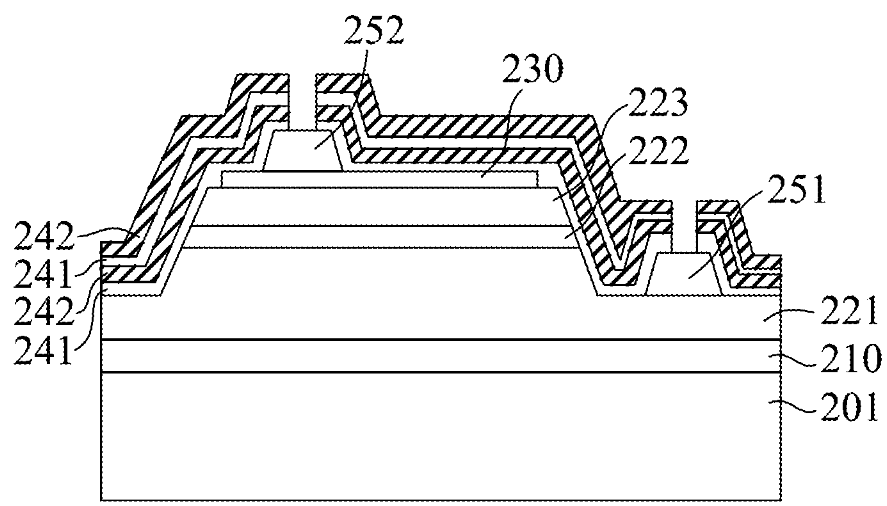
FIG. 9 is a schematic cross-sectional view illustrating a third embodiment of the light-emitting device according to the disclosure.

Referring to FIG. 9, a third embodiment of the light-emitting device according to the present disclosure is generally similar to the first embodiment, except that in the third embodiment, the light-emitting device includes a plurality of the insulating layers 241 and a plurality of the passivation layers 242 that are alternately stacked on the semiconductor light-emitting stack and that are formed into a laminate.

Specifically, the laminate includes a plurality of layer units, and each of the layer units includes one of the insulating layers 241 and one of the passivation layers 242 that is disposed on the one of the insulating layers 241. A number of the layer units may range from 2 to 5. In this embodiment, the thickness of each of the insulating layers 241 may range from 2 nm to 100 nm, and the thickness of each of the passivation layers 242 may range from 50 nm to 500 nm. A bottommost layer of the laminate that is proximate to the semiconductor light-emitting stack is one of the insulating layers 241, and a topmost layer of the laminate that is distal from the semiconductor light-emitting stack is one of the passivation layers 242 and has a thickness greater than that of each of the other ones of the passivation layers 242. In this embodiment, the bottommost layer of the laminate (i.e., the one of the insulating layers 241) that is proximate to the semiconductor light-emitting stack may reduce the built-in electric field effect, and simultaneously, by having the insulating layers 241 and the passivation layers 242 that are alternately stacked on the semiconductor light-emitting stack, and that have different pin-hole sizes, the hydrophobicity of the laminate may be increased. In addition, each of the pin-holes of the topmost layer of the laminate has a relatively small size, so as to reduce water vapor permeating into the light-emitting device, and increase the reliability of the light-emitting device.

The disclosure will be further described by way of the following examples. However, it should be understood that the following examples are solely intended for the purpose of illustration and should not be construed as limiting the disclosure in practice.

EXAMPLE AND COMPARATIVE EXAMPLE

To determine the stability (e.g., resistance to water vapor permeation) of the light-emitting device according to this disclosure, a light-emitting device (i.e., serving as a sample of the example) of this disclosure was prepared. For comparison purposes, another light-emitting device (i.e., serving as a sample of the comparative example) shown in FIG. 1 was also prepared. The samples of the example and the comparative example have the same size (the area of the horizontal cross-section is 20000 $\mu m^2$ and structure (including the semiconductor light-emitting stack, and have the same current spreading layer and two electrodes separated by a distance within a specified range of 50 μm). A surface of the sample of the comparative example is formed with a silicon dioxide layer serving as a protective layer. Two of the layer units are formed on the semiconductor light-emitting stack of the sample of the example (may refer to FIG. 9), wherein each of the layer units includes a silicon nitride layer (SiNx) and a silicon dioxide layer. The X here may range from 1.0 to 1.3. The silicon nitride layer of each of the layer units has a thickness ranging from 50 nm to 100 nm. The silicon dioxide layer that is proximate to the semiconductor light-emitting stack has a thickness ranging from 50 nm to 200 nm, and the other silicon dioxide layer has a thickness ranging from 50 nm to 500 nm.

Aging test

Figure 2:
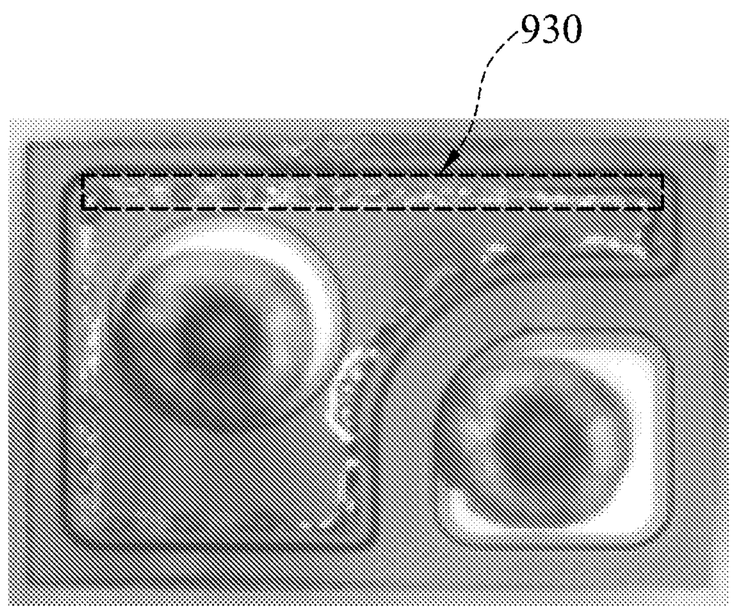
FIG. 2 is a picture showing the conventional light-emitting device of FIG. 1 subjected to an aging test for 168 hours (temperature: 85° C.; humidity: 85%; and applied reverse voltage: −10V)
Figure 3:
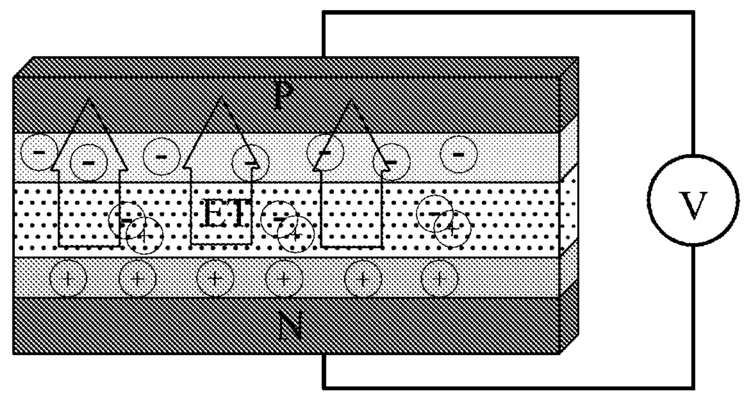
FIG. 3 is a schematic view illustrating a built-in electric field effect in a light-emitting device.
Figure 10:
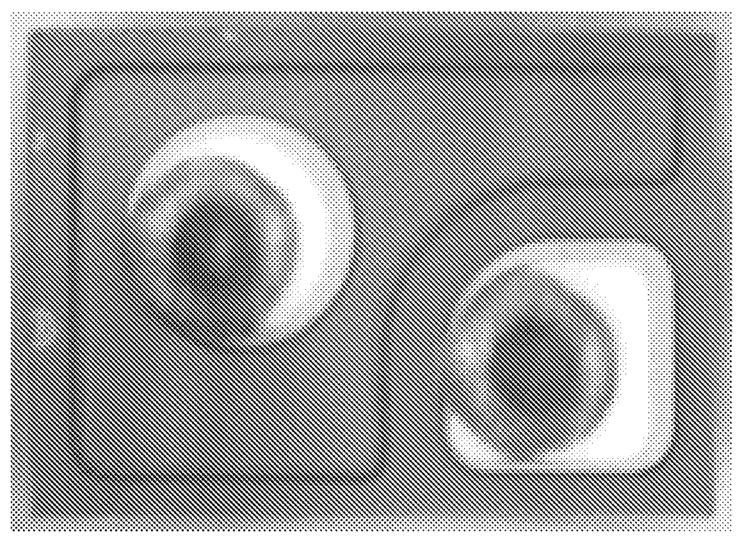
FIG. 10 is a picture showing the light-emitting device of FIG. 9 subjected to an aging test for 168 hours (temperature: 85° C., humidity: and applied reverse voltage: −10V)

The samples of the example and the comparative example were subjected to an aging test (temperature: 85° C., humidity: 85%, and applied reverse voltage: −10V). The results are shown in FIGS. 2 and 10. As shown in FIG. 2, the current spreading layer 930 of the sample of the comparative example is obviously burned in a peripheral region thereof. On the other hand, as shown in FIG. 10, there is no burn mark on the sample of the example.

Salt Water Test

Figure 4:
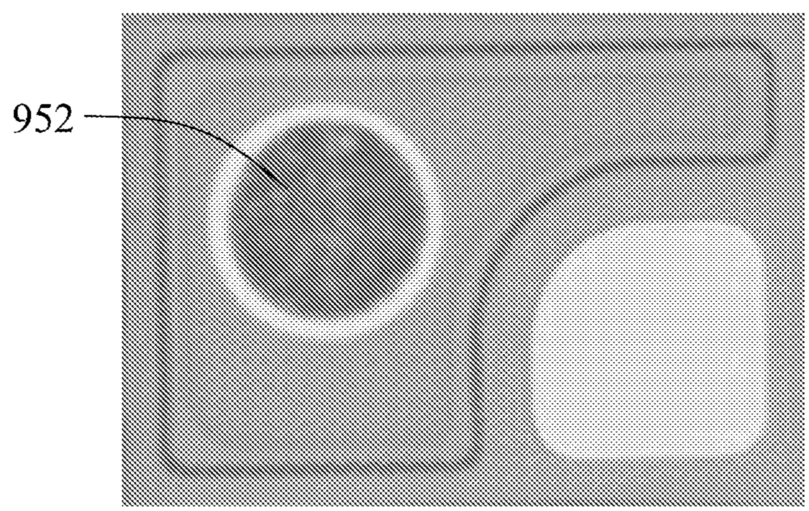
FIG. 4 is a picture showing the light-emitting device of FIG. 1 after being subjected to a salt water test for 20 hours.
Figure 11:
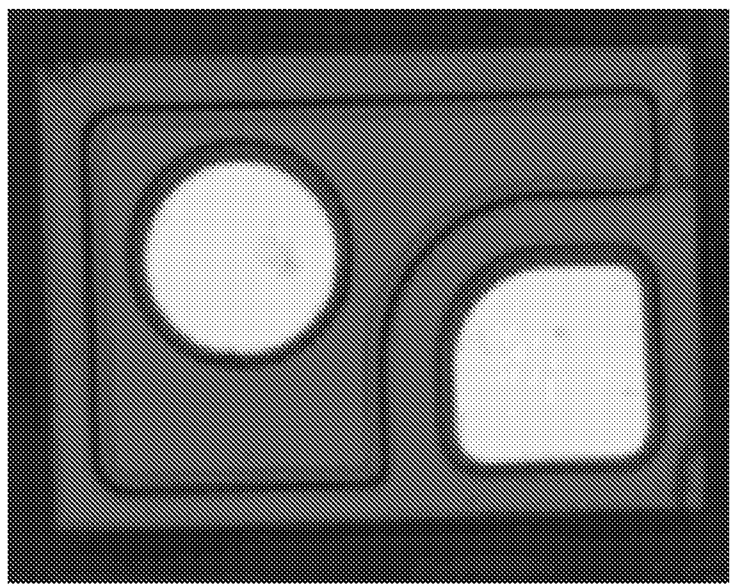
FIG. 11 is a picture showing the light-emitting device of FIG. 9 subjected to a salt water test for 20 hours.

The samples of the example and the comparative example were immersed in a salt water having a salt concentration of 0.9 wt % at room temperature. The results are shown in FIGS. 4 and 11. As shown in FIG. 4, the upper surface of the second electrode 952 of the sample of the comparative example is rough. In contrast, as shown in FIG. 11, the surfaces of the electrodes of the sample of example are not rough.

Salt Spray Test

Figure 5:
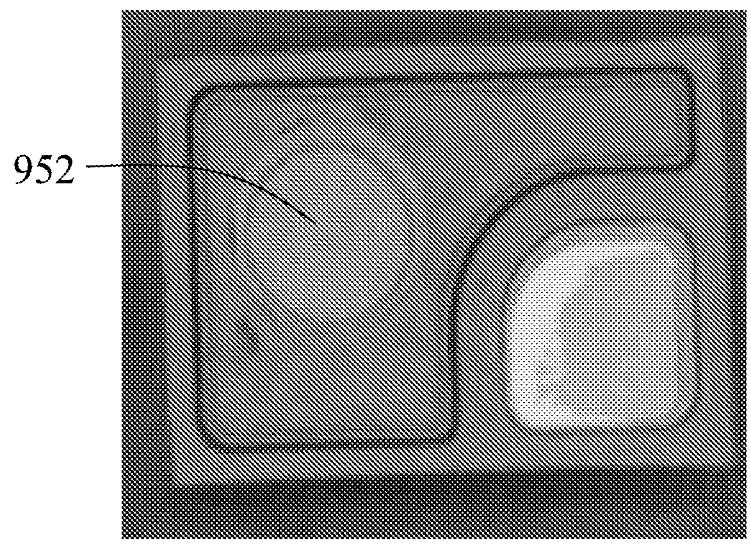
FIG. 5 is a picture showing the light-emitting device of FIG. 1 after being subjected to a salt spray test for 20 hours.
Figure 12:
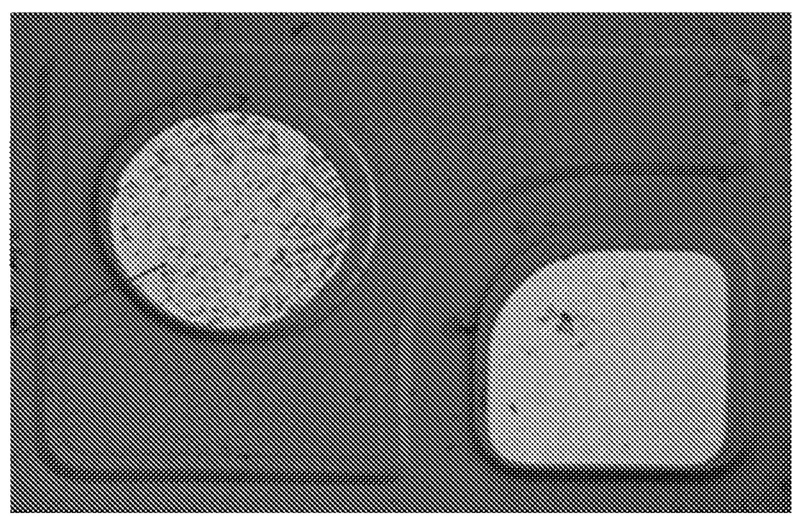
FIG. 12 is a picture showing the light-emitting device of FIG. 9 subjected to a salt spray test for 36 hours.

The samples of the example and the comparative example were placed in a salt water spray testing chamber at 35° C., and the salt concentration of the salt water is 5 wt %. The results are shown in FIGS. 5 and 12. As shown in FIG. 5, the first electrode 951 of the sample of the comparative example is partially peeled off. On the other hand, as shown in FIG. 12, the electrodes of the sample of example are not peeled off.

Elemental Analysis

After subjected to the salt spray test, the samples of the example and the comparative example were subjected to an elemental analysis using energy-dispersive X-ray (EDX) spectroscopy. The results are shown in Tables 1 and 2. The sample of the comparative example has an obvious migration of gold (see element AuM shown in Table 1), while the sample of the Example has no obvious migration of gold (no element AuM shown in Table 2). As such, the sample of the example has a relatively higher resistance to water vapor permeation. It is noted that the results of the elemental analysis were obtained through a matrix correction (ZAF matrix correction).

TABLE 1

| Element | Wt % | At % |
|---|---|---|
| CK (carbon concentration at K shell (orbit) | 7.85 | 34.02 |
| OK (oxygen concentration at K shell (orbit) | 9.19 | 29.90 |
| SiK (silicon concentration at K shell (orbit) | 8.92 | 16.52 |
| AuM (gold concentration at M shell (orbit) | 74.04 | 19.56 |

TABLE 2

| Element | Wt % | At % |
|---|---|---|
| CK | 7.78 | 14.90 |
| NK (nitrogen concentration at K shell (orbit) | 9.53 | 15.64 |
| OK | 24.46 | 35.15 |
| FeL (iron concentration at L shell (orbit) | 28.04 | 11.54 |
| GaL (gallium concentration at L shell (orbit) | 3.98 | 1.31 |
| SiK (silicon concentration at K shell (orbit) | 26.21 | 21.46 |

Figure 13:
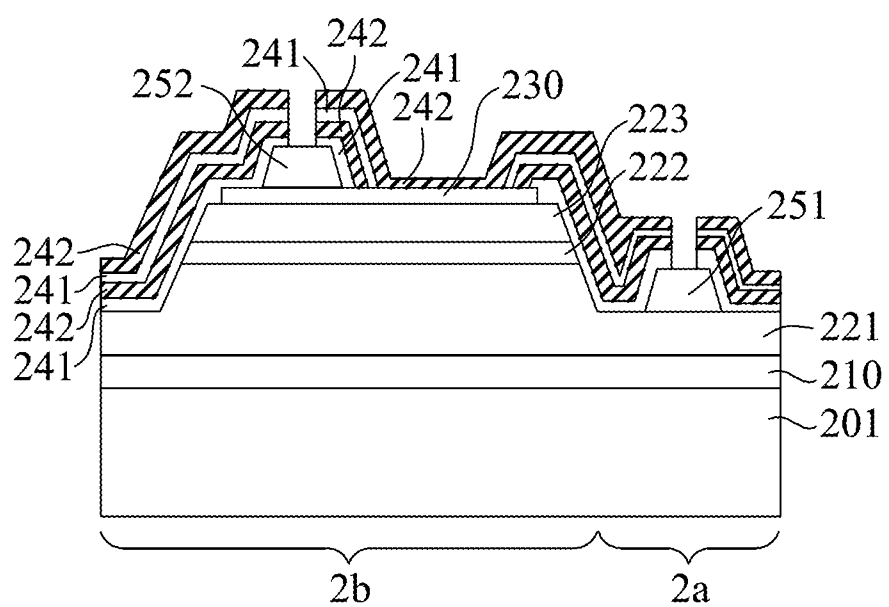
FIG. 13 is a schematic cross-sectional view illustrating a fourth embodiment of the light-emitting device according to the disclosure.

Referring to FIG. 13, a fourth embodiment of the light-emitting device according to the present disclosure is generally similar to the third embodiment, except for the following differences.

In this embodiment, a part of the topmost layer of the laminate (i.e., the one of the passivation layers 242) is in direct contact with the semiconductor light-emitting stack. In other words, the insulating layers 241 and passivation layers 242 except for the topmost layer of the laminate partially cover the semiconductor light-emitting stack, so as to expose a part of the first surface of the semiconductor light-emitting stack (in correspondence with the light-emitting area thereof), and the topmost layer of the laminate is thus in direct contact with the exposed first surface of the semiconductor light-emitting stack. With such configuration, impact of the laminate on the brightness of the light-emitting device might be reduced. Similar to the second embodiment, a portion of the bottomost layer of the laminate (i.e., one of the insulating layers 241) is partially disposed on the first electrode 251, extends to the interconnecting surface of the second part 2*b*, and partially covers the upper surface of the second part 2*b*. A region of the portion of the bottomost layer of the laminate, which is disposed on the upper surface of the second part 2*b*, has a width that is not smaller than 5 μm, such as ranging from 5 μm to 20 μm.

This disclosure also provides a display apparatus which includes the light-emitting device as mentioned above.

In the description above, for the purposes of explanation, numerous specific details have been set forth in order to provide a thorough understanding of the embodiments. It will be apparent, however, to one skilled in the art, that one or more other embodiments may be practiced without some of these specific details.

It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting device, comprising:

a semiconductor light-emitting stack including a first conductivity type semiconductor layer, a second conductivity type semiconductor layer, and an active layer disposed between said first conductivity type semiconductor layer and said second conductivity type semiconductor layer;

a first electrode disposed on said semiconductor light-emitting stack and electrically connected to said first conductivity type semiconductor layer;

a second electrode disposed on said semiconductor light-emitting stack and electrically connected to said second conductivity type semiconductor layer;

an insulating layer at least partially covering said semiconductor light-emitting stack; and a passivation layer disposed on said insulating layer and covering said semiconductor light-emitting stack, a side surface of said first electrode and a side surface of said second electrode, to expose an upper surface of each of said first electrode and said second electrode, wherein said first electrode and said second electrode are separated by a distance that is greater than 0 μm and that is not greater than 80 μm, and wherein said semiconductor light-emitting stack has a first surface that has a light-emitting area and an electrode area on which said first electrode and said second electrode are disposed, said passivation layer directly contacting a part of said light-emitting area.

2. The light-emitting device of claim 1, wherein said insulating layer is made of a material selected from the group consisting of $Si_{x1}N$, $Si_{x2}ON$, $Si_{x1}N$ doped with phosphorus, and $Si_{x2}ON$ doped with phosphorus, x1 being a mole ratio and ranging from 0.75 to 2, x2 being a mole ratio and ranging from 0.5 to 1.0.

3. The light-emitting device of claim 1, wherein said insulating layer has a thickness ranging from 2 nm to 100 nm.

4. The light-emitting device of claim 1, wherein said insulating layer is made of $Si_{x1}N$, x1 being a mole ratio and ranging from 0.8 to 2.

5. The light-emitting device of claim 1, wherein said insulating layer is formed to be disposed between said side surface of said first electrode and said passivation layer, and between said side surface of said second electrode and said passivation layer.

6. The light-emitting device of claim 1, wherein said passivation layer has a thickness ranging from 100 nm to 5 μm.

7. The light-emitting device of claim 1, comprising a plurality of said insulating layers and a plurality of said passivation layers that are alternately stacked on said semiconductor light-emitting stack and that are formed into a laminate that includes a plurality of layer units, each of said layer units including one of said insulating layers and one of said passivation layers that is disposed on said one of said insulating layers, the number of said layer units ranging from 2 to 5.

8. The light-emitting device of claim 7, wherein each of said passivation layers has a thickness ranging from 50 nm to 500 nm.

9. The light-emitting device of claim 7, wherein a topmost layer of said laminate that is distal from said semiconductor light-emitting stack is one of said passivation layers.

10. The light-emitting device of claim 1, wherein said passivation layer includes one of silicon oxide ($SiO_2$), aluminum oxide ($Al_2O_3$), and a combination thereof.

11. The light-emitting device of claim 1, wherein said insulating layer is made of SiaIN, and said passivation layer is made of $Si_{a2}N$, a1 being a mole ratio and being greater than 0.8 and being not greater than 2, a2 being a mole ratio and being not smaller than 0.6 and being not greater than 0.8.

12. The light-emitting device of claim 1, further comprising a substrate that is disposed on said semiconductor light-emitting stack opposite to the first and second electrodes, at least one side of an upper surface of said substrate having a length ranging from 40 μm to 300 μm.

13. The light-emitting device of claim 1, wherein the light-emitting device has a horizontal cross-sectional area that has a size ranging from 30000 $\mu m^2$ to 40000 $\mu m^2$, said distance ranging from 60 μm to 80 μm.

14. The light-emitting device of claim 1, wherein the light-emitting device has a horizontal cross-sectional area that has a size ranging from 20000 $\mu m^2$ to 30000 $\mu m^2$, said distance ranging from 40 μm to 60 μm.

15. The light-emitting device of claim 1, wherein the light-emitting device has a horizontal cross-sectional area that has a size that is greater than 0 $\mu m^2$ and that is not greater than 20000 $\mu m^2$, said distance ranging from 20 μm to 40 μm.

16. The light-emitting device of claim 1, wherein said semiconductor light-emitting stack includes a first part and a second part connected to said first part, said first electrode that is disposed on said first part, said second electrode that is disposed on said second part, each of said first part and said second part having an upper surface, said second part including a sidewall that has an interconnecting surface that interconnects said upper surface of said first part and said upper surface of said second part, said upper and interconnecting surfaces of said second part and said upper surface of said first part corporately forming a part of said first surface, a portion of said insulating layer being partially disposed on said first electrode, extending to said interconnecting surface of said second part, and partially covering said upper surface of said second part, a region of said portion of said insulating layer, which is disposed on said upper surface of said second part, having a width that is not smaller than 5 μm.

17. The light-emitting device of claim 16, wherein said width ranges from 5 μm to 20 μm.

18. The light-emitting device of claim 1, comprising a plurality of said insulating layers and a plurality of said passivation layers that are alternately stacked on said semiconductor light-emitting stack and that are formed into a laminate that includes a plurality of layer units, each of said layer units including one of said insulating layers and one of said passivation layers that is disposed on said one of said insulating layers, a bottommost layer of said laminate that is proximate to said semiconductor light-emitting stack being one of said insulating layers, a topmost layer of said laminate that is distal from said semiconductor light-emitting stack being one of said passivation layers and having a thickness greater than that of each of the other ones of said passivation layers.

19. A display apparatus, comprising the light-emitting device as claimed in claim 1.

20. A light-emitting device, comprising:

a semiconductor light-emitting stack including a first conductivity type semiconductor layer, a second conductivity type semiconductor layer, and an active layer disposed between said first conductivity type semiconductor layer and said second conductivity type semiconductor layer;

a first electrode disposed on said semiconductor light-emitting stack and electrically connected to said first conductivity type semiconductor layer;

a second electrode disposed on said semiconductor light-emitting stack and electrically connected to said second conductivity type semiconductor layer;

an insulating layer at least partially covering said semiconductor light-emitting stack; and a passivation layer disposed on said insulating layer and covering said semiconductor light-emitting stack, a side surface of said first electrode and a side surface of said second electrode, to expose an upper surface of each of said first electrode and said second electrode, wherein said first electrode and said second electrode are separated by a distance that is greater than 0 μm and that is not greater than 80 μm, and wherein said light-emitting device includes a plurality of said insulating layers and a plurality of said passivation layers that are alternately stacked on said semiconductor light-emitting stack and that are formed into a laminate that includes a plurality of layer units, each of said layer units including one of said insulating layers and one of said passivation layers that is disposed on said one of said insulating layers, the number of said layer units ranging from 2 to 5.

* * * * *